United States Patent
Lin et al.

(10) Patent No.: US 8,314,434 B2
(45) Date of Patent: Nov. 20, 2012

(54) LIGHT EMITTING DIODE MODULE AND METHOD OF MAKING THE SAME

(75) Inventors: Chih-Sheng Lin, Tainan County (TW); Shun-Hong Zheng, Tainan County (TW)

(73) Assignee: Ubilux Optoelectronics Corporation, Tainan County (TW)

( * ) Notice: Subject to any disclaimer, the term of this patent is extended or adjusted under 35 U.S.C. 154(b) by 71 days.

(21) Appl. No.: 12/968,589

(22) Filed: Dec. 15, 2010

(65) Prior Publication Data

US 2011/0278600 A1    Nov. 17, 2011

(30) Foreign Application Priority Data

May 17, 2010 (TW) ................................ 99115674 A

(51) Int. Cl.
*H01L 33/00* (2010.01)
(52) U.S. Cl. ................ 257/88; 257/90; 257/91; 257/94; 257/95; 438/34
(58) Field of Classification Search ............. 257/88, 257/90–91, 94–95, E33.045, E21.158; 438/34
See application file for complete search history.

(56) References Cited

U.S. PATENT DOCUMENTS

| | | | | |
|---|---|---|---|---|
| 7,713,769 B2 * | 5/2010 | Lin et al. | ......................... | 438/29 |
| 7,777,242 B2 * | 8/2010 | Yoneda | ......................... | 257/98 |

* cited by examiner

*Primary Examiner* — Theresa T Doan
(74) *Attorney, Agent, or Firm* — Renner, Otto, Boisselle & Sklar, LLP

(57) ABSTRACT

A light emitting diode module includes a substrate, at least two spaced apart light emitting diodes formed on the substrate, an insulating layer, and an electrically conductive layer. Each of the light emitting diodes includes a light emitting unit, an n-electrode, and a p-electrode. The light emitting unit has first and second portions. The first portion has an n-type top face and a first stepped side. The second portion has a p-type top face and a second stepped side. The insulating layer is formed on the n-type top face and the first stepped side of the first portion of one of the light emitting diodes, and the second stepped side and the p-type top face of the second portion of the other one of the light emitting diodes. The electrically conductive layer is formed on the insulating layer. A method of making the light emitting diode module is also disclosed.

3 Claims, 5 Drawing Sheets

LIGHT EMITTING DIODE MODULE AND METHOD OF MAKING THE SAME

CROSS-REFERENCE TO RELATED APPLICATION

This application claims priority of Taiwanese application no. 099115674, filed on May 17, 2010.

BACKGROUND OF THE INVENTION

1. Field of the Invention

This invention relates to a light emitting diode module, more particularly to a light emitting diode modulo including light emitting diodes having stepped sides, and a method of making the same.

2. Description of the Related Art

Referring to FIG. 1, a conventional light emitting diode (LED) module 1 includes a substrate 11, and a plurality of LEDs 12 that are formed on the substrate 11 and that are arranged in an array. Since the LEDs 12 adjacent to each other are electrically interconnected in the same manner, only two of the LEDs 12 are shown in FIG. 1 for the sake of clarity.

Each of the LEDs 12 includes a light emitting unit 121, a p-electrode 122, and an n-electrode 123. The p-electrode 122 and the n-electrode 123 are formed on the light emitting unit 221. Confronting lateral sides 124 of the adjacent pair of the light emitting units 121 and a portion of a top surface 111 of the substrate 11 cooperatively define a groove 120. An insulating layer 13 is formed in the groove 120 and on a portion of each of the light emitting units 121. The insulating layer 13 is in contact with the n-electrode 123 on one of the light emitting units 121 and the p-electrode 122 on the other one of the light emitting units 121. An electrically conductive layer 14 is formed on the insulating layer 13 so that two ends thereof are in contact with the n-electrode 123 on one of the light emitting units 121 and the p-electrode 122 on the other one of the light emitting units 121 to establish an electrical connection.

The insulating layer 13 is formed by virtue of a spin-on-glass (SOG) coating process. Specifically, the groove 120 is filled with a liquid solution containing a dielectric material (e.g., $SiO_2$) using a spin-coating process, and the aforementioned liquid solution is also disposed on the portion of each of the adjacent pair of the light emitting units 121 via the spin coating process. Subsequently, a heating process is conducted so as to evaporate a solvent in the aforementioned liquid solution. Consequently, the remaining solidified dielectric material forms the insulating layer 13.

Each of the confronting lateral sides 129 of the light emitting units 121 extends upwardly from the substrate 11, and thus has a relatively high vertical face. Uniformly coating the dielectric material on the relatively high vertical faces of the lateral sides 124 is difficult. Referring to FIG. 2, if an insulating layer 13' is formed on the confronting lateral sides 124 as a thin film, the insulating layer 13' will be non-uniform at the vertically extending portions thereof. Likewise, if an electrically conductive layer 14' is formed on the insulating layer 13', a uniform vertical conductive layer will be hardly formed on the relatively high vertical faces of the confronting lateral sides 124. The non-uniform electrically conductive layer 14' may break even when a small current is applied to the LED module 1.

Accordingly, the groove 120 has to be filled with the insulating layer 13 as shown in FIG. 1 to reduce the length of the vertically extending portion of the electrically conductive layer 19 to be formed on the insulating layer 13. The insulating layer 13 filled in the groove 120 has a thickness of about several micrometers. When the insulating layer 13 is made from $SiO_2$, the insulating layer 13 which fills the groove 120 has a transmittance substantially as low as 25% to 45% for light having a wavelength of 455 nm, thereby reducing the rate of lateral emission of light and hence light emitting efficiency of LED module 1.

In addition, vacuum deposition processes (e.g., sputtering, evaporation, etc.) are not suitable to form the insulating layer 13 shown in FIG. 1 since the vacuum deposition processes require longer time to form a film having a thickness of several micrometers compared to the spin-coating process. Although the spin-coating process provides a fast rate of forming a film, the thickness of the film can not be controlled precisely. A chemical mechanical polishing (CMP) process is necessary to polish an uneven surface of a thick film made using the spin-coating process. However, equipment for the CMP process is costly and may therefore increase a production cost of the LED module 1.

SUMMARY OF THE INVENTION

The object of the present invention is to provide a light emitting diode module that can overcome the aforesaid drawbacks of the prior art, and a method of making the same.

According to one aspect of this invention, there is provided a light emitting diode module. The light emitting diode module includes a substrate, at least two light emitting diodes, an insulating layer, and an electrically conductive layer.

The light emitting diodes are formed on the substrate and are spaced apart from each other. Each of the light emitting diodes includes a light emitting unit, an n-electrode, and a p-electrode. The light emitting unit has first and second portions that are connected to each other. The first portion of the light emitting unit of one of the light emitting diodes is formed adjacent to the second portion of the light emitting unit of the other one of the light emitting diodes. The first portion of the light emitting unit of each of the light emitting diodes has an n-type top face that supports the n-electrode, and a first stepped side that extends downwardly and inclinedly from the n-type top face to the substrate. The first stepped side has two first inclined surfaces and a first connection surface formed between the two first inclined surfaces. The second portion of the light emitting unit of each of said light emitting diodes has a p-type top face that supports the p-electrode, and a second stepped side that extends downwardly and inclinedly from the p-type top face to the substrate. The second stepped side has at least two second inclined surfaces and at least one second connection surface formed between the second inclined surfaces.

The insulating layer is formed on the first and second portions that are adjacent to each other, and extends downwardly and steppedly from the n-type top face to the first stepped side of the first portion, and then upwardly and steppedly from the second stepped side to the p-type top face of the second portion. The insulating layer has two ends that contact the n-electrode on the n-type top face and the p-electrode on the p-type top face, respectively.

The electrically conductive layer is formed on the insulating layer and has two ends that are respectively in contact with the n-electrode on the n-type top face and the p-electrode on the p-type top face.

According to another aspect of this invention, there is provided a method of making a light emitting diode module. The method comprises: forming an epitaxial layer on a substrate; etching the epitaxial layer to form a plurality of high regions and a plurality of connecting regions among the high regions; partially etching each of the connecting regions to form a first inclined surface extending downwardly from the corresponding one of the connecting regions, and a second inclined surface and a second connection surface, the second inclined surface and the second connection surface being formed steppedly and downwardly from one of the high regions proximate to the first inclined surfaces; further etching partially each of the connecting regions until the substrate is exposed, such that an additional first inclined surface and a first connection surface are formed in connection with the first inclined surface, and such that an additional second inclined surface and an additional second connection surface are formed in connection with the second inclined surface and the second connection surface; depositing an insulating layer on the epitaxial layer that has been etched; forming an electrically conductive layer on the insulating layer; and forming n-electrodes and p-electrodes for the light emitting regions.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF TEE PREFERRED EMBODIMENTS

Figure 3:
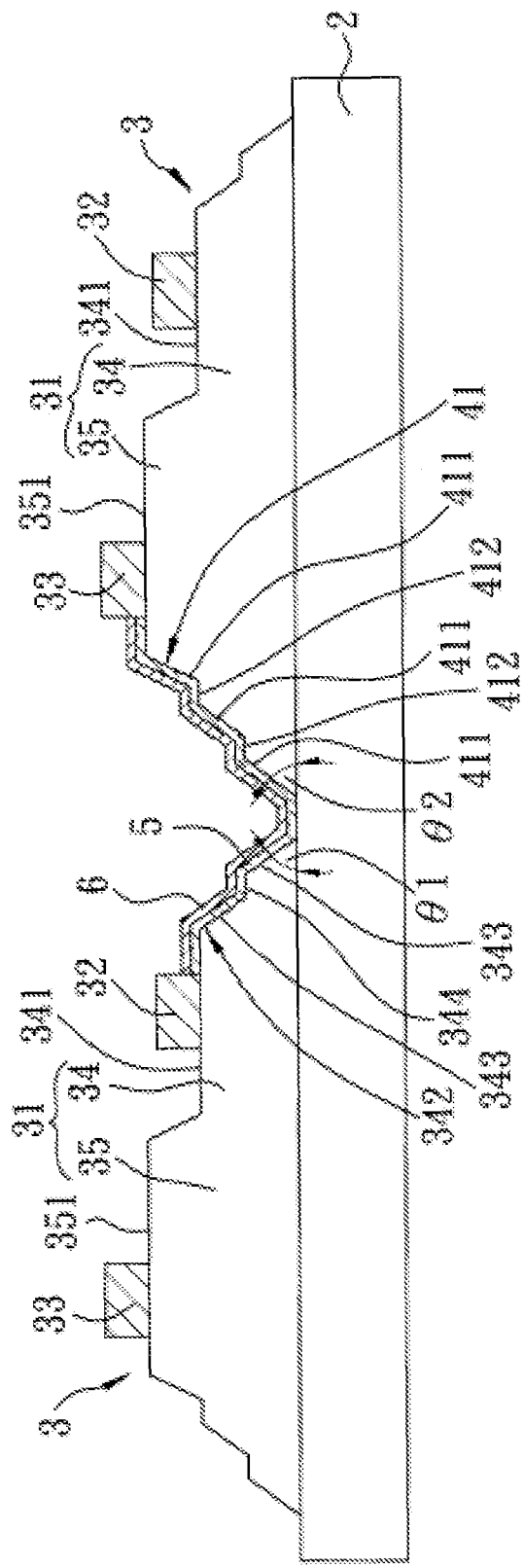
FIG. 3 is a schematic partly sectional view of the preferred embodiment of a light emitting diode module according to this invention.

Referring to FIG. 3, the preferred embodiment of a light emitting diode (LED) module according to the present invention is adapted to be activated by direct current or alternating current. The LED module includes a substrate 2, a plurality of LEDs 3 (only two of the LEDs 3 are shown), an insulating layer 5, and an electrically conductive layer 6. In this embodiment, the substrate 2 is a sapphire ($Al_2O_3$) substrate. It should be noted that the substrate 2 could be made from other material (such as GaAs, Si, SiC, GaN, ZnO, etc.) in other embodiments.

The LEDs 3 are formed on the substrate 2 and are spaced apart from each other. Each of the LEDs 3 includes a light emitting unit 31, an n-electrode 32, and a p-electrode 33. The light emitting unit 31 is made from an epitaxial structure that generally has a p-type semiconductor layer, an n-type semiconductor layer, an active layer, etc. Since the feature of the invention does not reside in the epitaxial structure, which is know in the art, further details of the same are omitted herein for the sake of brevity.

The light emitting unit 31 of each of the LEDs 3 has first and second portions 34, 35 that are connected to each other. The first portion 34 of the light emitting unit 31 of one of the LEDs 3 is formed adjacent to the second portion 35 of the light emitting unit 31 of the other one of the LEDs 3. The first portion 34 of the light emitting unit 31 has a top layer that is composed of an n-type semiconductor material, and hence has an n-type top face 341. The n-type top face 341 supports the n-electrode 32. The first portion 34 of the light emitting unit 31 further has a first stepped side 342 that extends downwardly and inclinedly from the n-type top face 341 to the substrate 2. The first stepped side 342 has two first inclined surfaces 393 and a horizontal first connection surface 344 that is formed between the two first inclined surfaces 343. Preferably, each of the first inclined surfaces 343 is inclined with respect to a plane substantially parallel to the substrate 2 by an angle ($\theta 1$) that ranges from 15° to 58°.

The second portion 35 of the light emitting unit 31 has a top layer that is composed of a p-type semiconductor material, and hence has a p-type top face 351. The p-type top face 351 supports the p-electrode 33 and is higher than the n-type top face 341. The second portion 35 of the light emitting unit 31 further has a second stepped side 41 that extends downwardly and inclinedly from the p-type top face 351 to the substrate 2. The second stepped side 41 has three second inclined surfaces 411 and two horizontal second connection surfaces 412. Each of the second connection surfaces 412 is formed between two of the second inclined surfaces 411. Preferably, each of the second inclined surfaces 411 is inclined with respect to the plane substantially parallel to the substrate 2 by an angle ($\theta 2$) that ranges from 15° to 58°.

The n-electrode 32 and the p-electrode 33 are made from an electrically conductive metallic material, and are respectively formed on the n-type top face 341 and the p-type top face 351. Therefore, the n-electrode 32 and the p-electrode 33 are respectively and electrically connected to the n-type semiconductor materials and the p-type semiconductor materials of the light emitting units 31. It should be noted that the n-electrode 32 and the p-electrode 33 could be made from any suitable material as long as the material permits an external current to flow to the respective light emitting unit 31 via the p-electrode 33 and then to the n-electrode 32.

The insulating layer 5 is made from silicon dioxide ($SiO_2$), and is formed on the first and second portions 34, 35 that are adjacent to each other. The insulating layer 5 extends downwardly and steppedly from the n-type top face 341, to the first stepped side 342 of the first portion 34, to the substrate 2, and then upwardly and steppedly from the second stepped side 41 to the p-type top face 351 of the second portion 35. The insulating layer 5 has two ends that contact the n-electrode 32 on the n-type top face 341 of one of the LEDs 3 and the p-electrode 33 on the p-type top face 351 of the other one of the LEDs 3, respectively. Thus, the insulating layer 5 is formed on an area between the n-electrode 32 of one of the LEDs 3 and the p-electrode 33 of the other one of the LEDs 3. In this embodiment, the insulating layer 5 has a thickness of about 4000 angstrom (Å). Of course, the insulating layer 5 may have a thickness in a range of 4000±300 Å. The thickness may vary depending on the operating voltage of the LED module.

The electrically conductive layer 6 is formed steppedly on the insulating layer 5, and has two ends that are respectively in contact with the n-electrode 32 on the n-type top face 341 of one of the LEDs 3 and the p-electrode 33 on the p-type top face 351 of the other one of the LEDs 3. Consequently, the n-electrode 32 and the p-electrode 33 of the two LEDs 3 can be electrically connected to each other by virtue of the electrically conductive layer 6.

Figure 4:
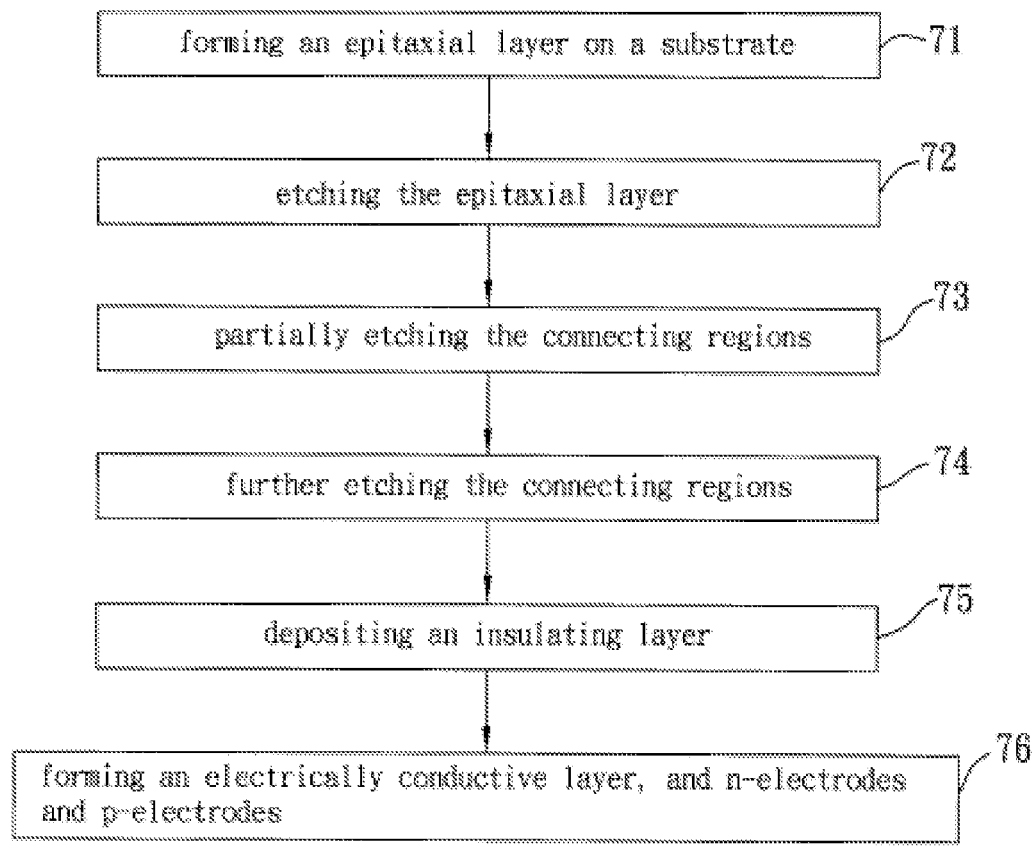
FIG. 4 is a flow chart of the preferred embodiment of a method of making a light emitting diode module according to this invention.
Figure 5:
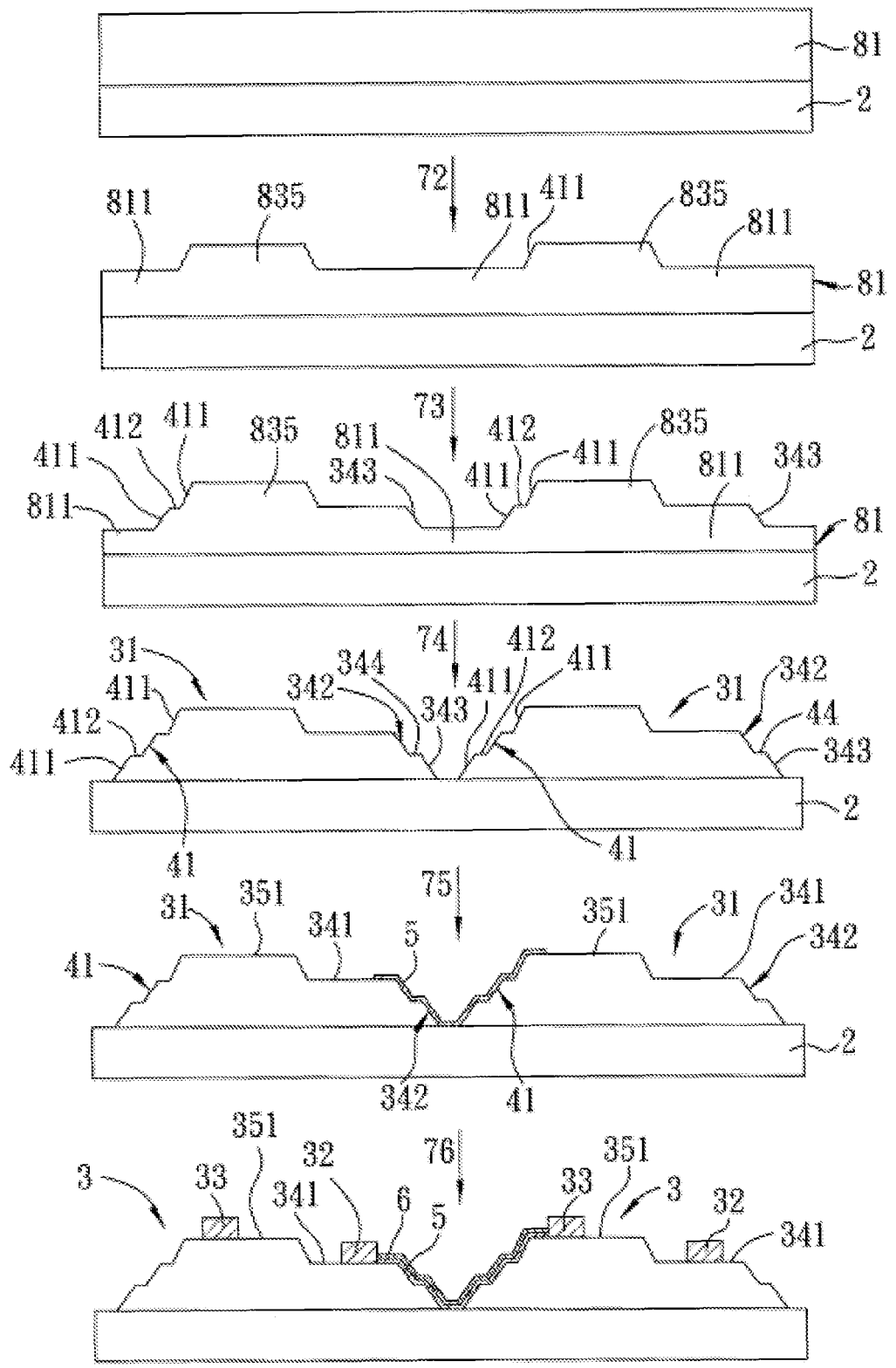
FIG. 5 shows consecutive steps of the method of the preferred embodiment.

Referring to FIGS. 4 and 5, the preferred embodiment of a method of making a LED module according to the present invention can be conducted to make the LED module shown in FIG. 3 and includes steps 71-76. The method is described as follows.

In step 71, an epitaxial layer 81 is formed on the substrate 2. The epitaxial layer 81 has a p-type semiconductor layer, an n-type semiconductor layer, and an active layer. A top surface of the epitaxial layer 81 is flat.

In step 72, the epitaxial layer 81 is etched so as to form a plurality of high regions 835 and a plurality of connecting regions 811 among the high regions 835. The high regions 811 will form the second portions 35 of the light emitting units 31. The connecting regions 811 will form the first portions 34 of the light emitting units 31.

In steps 73 and 74, each of the connecting regions 811 is etched. For the sake of brevity, only how one of the connecting regions 811 is etched is described hereinafter. In step 73, the connecting region 811 is partially etched to form the first inclined surface 343, and one of the second inclined surfaces 411 and one of the second connection surfaces 412.

In step 74, the connecting region 811 is further etched until the substrate 2 is exposed, such that one additional first inclined surface 343 and the first connection surface 344 are formed in connection with the first inclined surface 343 formed previously, and such that one additional second inclined surface 911 and one additional second connection surface 412 are formed in connection with one of the second inclined surfaces 411 formed previously and the second connection surface 412 formed previously. Accordingly, the first stepped side 342 and the second stepped side 41 are formed. The etching steps 73, 74 are conducted by virtue of an inductively coupled plasma (ICP), etching process and a suitable mask.

In step 75, the insulating layer 5 is formed continuously and steppedly on the n-type top face 341 and the first stepped side 342 of one of the light emitting units 31, the substrate 2, and the second stepped side 41 and the p-type top face 351 of the other one of the light emitting units 31, by depositing $SiO_2$ using a plasma enhanced chemical vapor deposition (PECVD) process. The insulating layer 5 can be formed to have a desired thickness using the PECVD process since the PECVD process is able to control deposition time.

In step 76, by dint of a suitable mask, the electrically conductive layer 6 is formed on the insulating layer 5 simultaneously with the formation of the n-electrode 32 and the p-electrode 33 on the light emitting units 31.

According to the present invention, the insulating layer 5 can be uniformly formed by deposition on the first and second stepped sides 312, 41 since the first and second stepped sides 342, 41 have inclined surfaces rather than having steep vertical surfaces. Thus, the electrically conductive layer 6 can be uniformly formed on the insulating layer 5.

The insulating layer 5 of this invention may have a thickness smaller than 1 µm and thus is a thin film having a thickness of about hundreds of nanometers (nm). Therefore, blocking of lateral light emission can be alleviated. Transmittance of the insulating layer 5 for light having a wavelength of 455 nm is up to 88%, thereby improving lateral light emission ratio. Light emitting efficiency of the LED module of this invention is hence higher than that of the conventional LED module 1 shown in FIG. 1. Since the insulating layer 5 is a thin film, a vacuum deposition process (e.g., evaporation, sputtering, etc.) may be employed. Therefore, processing time can be reduced, the thickness of the film can be precisely controlled, and a CMP process is not needed. Accordingly, a production cost of the LED module of this invention is lower than that of the conventional LED module 1 shown in FIG. 1.

1$^{st}$ Experiments

Figure 1:
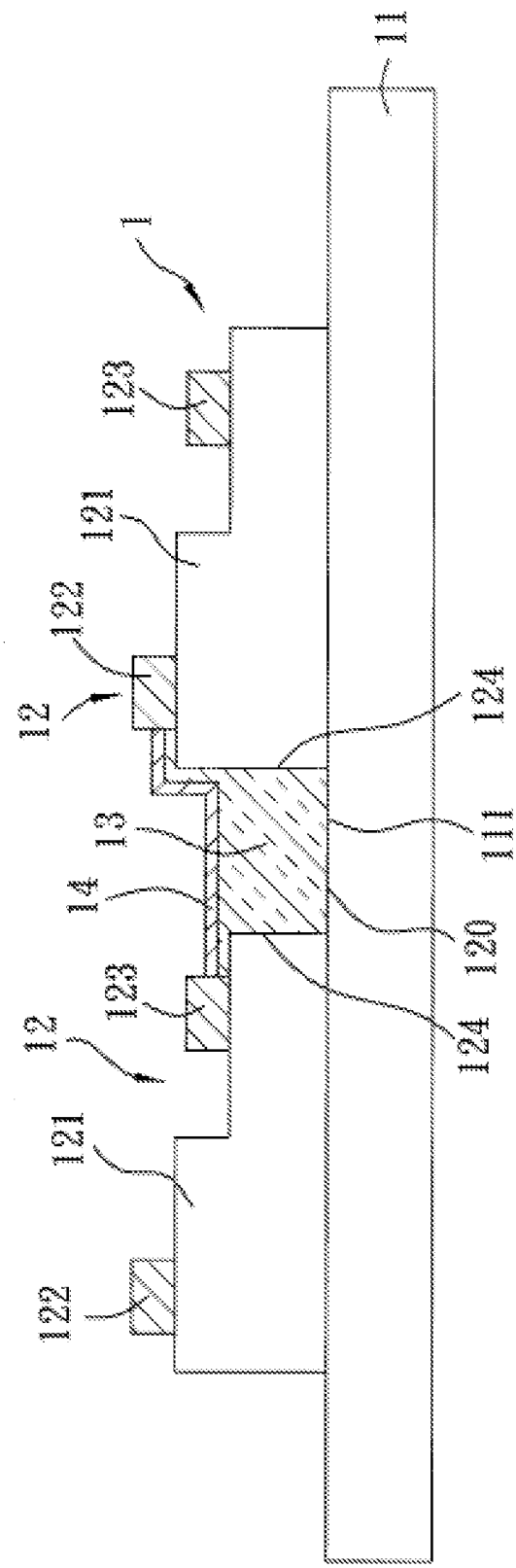
FIG. 1 is a schematic partly sectional view of a conventional light emitting diode module.
Figure 2:
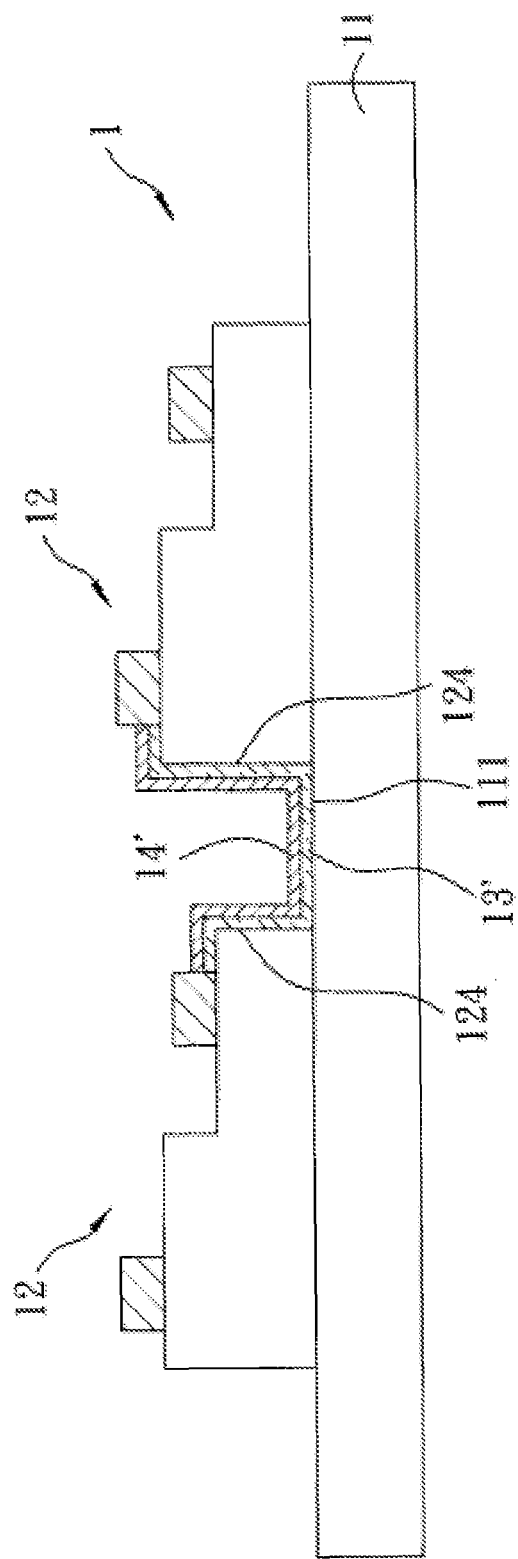
FIG. 2 is a schematic partly sectional view illustrating why it is difficult to provide the conventional light emitting diode module with a uniform thin insulating layer.

The following experiments were performed to compare the LED module of this invention and the conventional LED module 1 shown in FIG. 1. Each of Example of the LED module of this invention and Comparative Example of the conventional LED module 1 shown in FIG. 1 has a 7×7 array of LEDs (i.e., 7 rows and 7 columns, a total of 49 LEDs). Each of the LEDs has a chip size of 4.1 mm², and each of Example and Comparative Example has a size of 30.08 mm². Comparative Example has a plurality of the electrically conductive layers 14 shown in FIG. 1. When a voltage of 155 V and a current of 17 mA were applied to both of Example and Comparative Example, Example had light output power of 247 mW, and Comparative Example had light, output power of 216 mW. The light output power of Example is higher than that of Comparative Example by 14.35% ([{247−216}/(216)]×100%=14.35%)

2$^{nd}$ Experiment

When the vacuum deposition process is conducted with the same conditions and the mask having the same line width to form the electrically conductive layer 6, the angles (θ1, θ2) (i.e., slopes of the first and second inclined surfaces 343, 411) may affect a width of the electrically conductive layer 6 since a slope of a surface may influence adhesion of a vacuum deposited film to the surface. The width of the electrically conductive layer 6 may be smaller at an inclined surface than at a horizontal surface. In order to determine an optimal range for each of the angles (θ1, θ2), the following experiments were performed. Examples 1-4 and Comparative Examples 1-3 are LED modules formed using the method of this invention. However, the angles (θ1, θ2) of Examples 1-4 and Comparative Examples 1-3 are shown in Table 1. A mask having a line width of 6 µm was used to form the examples so that the width of the electrically conductive layer 6 is not overly broad, and a proportion of an area for forward light emission of the LEDs 3 shielded by the electrically conductive layer 6 can be reduced. Examples 1-4 and Comparative Examples 1-3 were tested for a breakdown current. The results are shown in Table 1.

TABLE 1

|  | Example 1 | Example 2 | Example 3 | Example 4 | Comparative Example 1 | Comparative Example 2 | Comparative Example 3 |
|---|---|---|---|---|---|---|---|
| θ1, θ2 (degree) | 15 | 23 | 40 | 53 | 63 | 75 | 84 |
| Width of stepped portions of electrically conductive layer 6 (µm) | 6 | 6 | 6 | 5.2 | 4.4 | 2.2 | 0.5 |
| Breakdown current (mA) | 58 | 58 | 58 | 55 | 36 | 18 | 12 |

Referring to Table 1, the width of the electrically conductive layer 6 at the inclined surfaces thereof of each of Examples 1, 2, 3 having the angles (θ1, θ2) smaller than or equal to 40° is about 6 µm. However, the larger the angles (θ1, θ2) (i.e., the steeper the first and second inclined surfaces 343, 411), the smaller the width of the electrically conductive layer 6 at the inclined surfaces thereof. Consequently, the smaller width of the electrically conductive layer 6 led to reduction in breakdown current of the electrically conductive layer 6. The breakdown current used herein refers to a current level at which the electrically conductive layer 6 breaks down.

Considering a LED module having power of 5 W, when a voltage of 110 V is applied, a maximum current in the LED module is 45 mA (5 W/110 V=45.45 mA). The breakdown current of the electrically conductive layer 6 is hence required to be larger than 45 mA. Table 1 shows that Examples 1-4 can endure a current of more than 55 mA and that the endurance of Comparative Examples 1-3 is low because of the relatively small width of the electrically conductive layers 6 of Comparative Examples 1-3. The breakdown currents of Comparative Examples 1-3 are not larger than 45 mA.

Based on the aforementioned results, the optimal ranges for the angles ($\theta 1$, $\theta 2$) are as follows: $15°\leqq\theta 1\leqq 58°$ and $15°\leqq\theta 2\leqq 58°$. When the angles ($\theta 1$, $\theta 2$) are larger than 58°, the minimum width of the electrically conductive layer 6 will be small and the breakdown current endurance will be insufficient. The angles ($\theta 1$, $\theta 2$) smaller than 15° are not suitable for the structural design of the LEDs 3 because the distances between adjacent LEDs 3 are limited. It should be noted that the angles ($\theta 1$, $\theta 2$) are not required to be equal to each other, but are only needed to reside in the aforementioned optimal ranges.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A light emitting diode module comprising:
a substrate;
at least two light emitting diodes formed on said substrate and spaced apart from each other, each of said light emitting diodes including a light emitting unit, an n-electrode, and a p-electrode, said light emitting unit having first and second portions that are connected to each other, said first portion of said light emitting unit of one of said light emitting diodes being formed adjacent to said second portion of said light emitting unit of the other one of said light emitting diodes, said first portion of said light emitting unit of each of said light emitting diodes having an n-type top face that supports said n-electrode, and a first stepped side that extends downwardly and inclinedly from said n-type top face to said substrate, said first stepped side having two first inclined surfaces and a first connection surface formed between said two first inclined surfaces, said second portion of said light emitting unit of each of said light emitting diodes having a p-type top face that supports said p-electrode, and a second stepped side that extends downwardly and inclinedly from said p-type top face to said substrate, said second stepped side having at least two second inclined surfaces and at least one second connection surface formed between said second inclined surfaces;
an insulating layer formed on said first and second portions that are adjacent to each other, and extending downwardly and steppedly from said n-type top face to said first stepped side of said first portion, and then upwardly and steppedly from said second stepped side to said p-type top face of said second portion, said insulating layer having two ends that contact said n-electrode on said n-type top face and said p-electrode on said p-type top face, respectively; and
an electrically conductive layer formed on said insulating layer and having two ends that are respectively in contact with said n-electrode on said n-type top face and said p-electrode on said p-type top face.

2. The light emitting diode module of claim 1, wherein each of said first and second inclined surfaces is inclined with respect to a plane substantially parallel to said substrate by an angle that ranges from 15° to 58°.

3. The light emitting diode module of claim 1, wherein said p-type top face is higher than said n-type top face, said second stepped side having three of said second inclined surfaces and two of said second connection surfaces, each of which is formed between two of said second inclined surfaces.

* * * * *